US009202882B2

(12) United States Patent
Henson et al.

(10) Patent No.: US 9,202,882 B2
(45) Date of Patent: Dec. 1, 2015

(54) SEMICONDUCTOR DEVICE WITH A THICK BOTTOM FIELD PLATE TRENCH HAVING A SINGLE DIELECTRIC AND ANGLED SIDEWALLS

(71) Applicant: International Rectifier Corporation, El Segundo, CA (US)

(72) Inventors: Timothy D. Henson, Torrance, CA (US); Kapil Kelkar, Torrance, CA (US); Ljubo Radic, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/267,787

(22) Filed: May 1, 2014

(65) Prior Publication Data

US 2014/0339670 A1    Nov. 20, 2014

Related U.S. Application Data

(60) Provisional application No. 61/824,235, filed on May 13, 2013.

(51) Int. Cl.

| *H01L 31/113* | (2006.01) |
|---|---|
| *H01L 21/336* | (2006.01) |
| *H01L 21/3205* | (2006.01) |
| *H01L 29/40* | (2006.01) |
| *H01L 29/78* | (2006.01) |
| *H01L 29/66* | (2006.01) |
| *H01L 21/765* | (2006.01) |
| *H01L 21/308* | (2006.01) |

(52) U.S. Cl.
CPC .......... *H01L 29/407* (2013.01); *H01L 21/3083* (2013.01); *H01L 21/765* (2013.01); *H01L 29/66674* (2013.01); *H01L 29/7801* (2013.01)

(58) Field of Classification Search
CPC ............. H01L 29/407; H01L 29/4236; H01L 29/66704; H01L 29/7397; H01L 29/7827
USPC .......... 438/259, 270, 271, 589; 257/328, 330, 257/341
See application file for complete search history.

(56) References Cited

U.S. PATENT DOCUMENTS

| 5,300,450 A | 4/1994 | Shen ............................... 437/52 |
| 6,444,528 B1 | 9/2002 | Murphy |
| 7,012,005 B2 | 3/2006 | Lichtenberger |
| 8,101,484 B2 | 1/2012 | Bencuya |
| 8,143,123 B2 | 3/2012 | Grebs |
| 8,143,124 B2 | 3/2012 | Challa |
| 8,252,647 B2 | 8/2012 | Lee |
| 2005/0173758 A1* | 8/2005 | Peake et al. ................... 257/330 |

(Continued)

OTHER PUBLICATIONS

U.S. Appl. No. 61/824,235, filed May 16, 2013, Henson.

*Primary Examiner* — Hsien Ming Lee
(74) *Attorney, Agent, or Firm* — Farjami & Farjami LLP

(57) ABSTRACT

Disclosed is a power device, such as a power MOSFET device and a method for fabricating same. The device includes a field plate trench. The field plate trench has a predetermined width and a predetermined sidewall angle. The device further includes a single trench dielectric on sidewalls of the field plate trench and at a bottom of the field plate trench. The single trench dielectric has a bottom thickness that is greater than a sidewall thickness. The device also includes a field plate situated within the single trench dielectric.

20 Claims, 4 Drawing Sheets

(56) References Cited

U.S. PATENT DOCUMENTS

| | | | |
|---|---|---|---|
| 2007/0108511 A1 | 5/2007 | Hirler | 257/328 |
| 2007/0181975 A1 | 8/2007 | Koops | 257/559 |
| 2009/0085107 A1 | 4/2009 | Hshieh | |
| 2011/0254088 A1* | 10/2011 | Darwish et al. | 257/340 |
| 2012/0309200 A1 | 12/2012 | Tay | |
| 2013/0248987 A1* | 9/2013 | Okuhata | 257/330 |
| 2014/0339651 A1 | 11/2014 | Henson | 257/409 |
| 2014/0339669 A1 | 11/2014 | Henson | 257/488 |

* cited by examiner

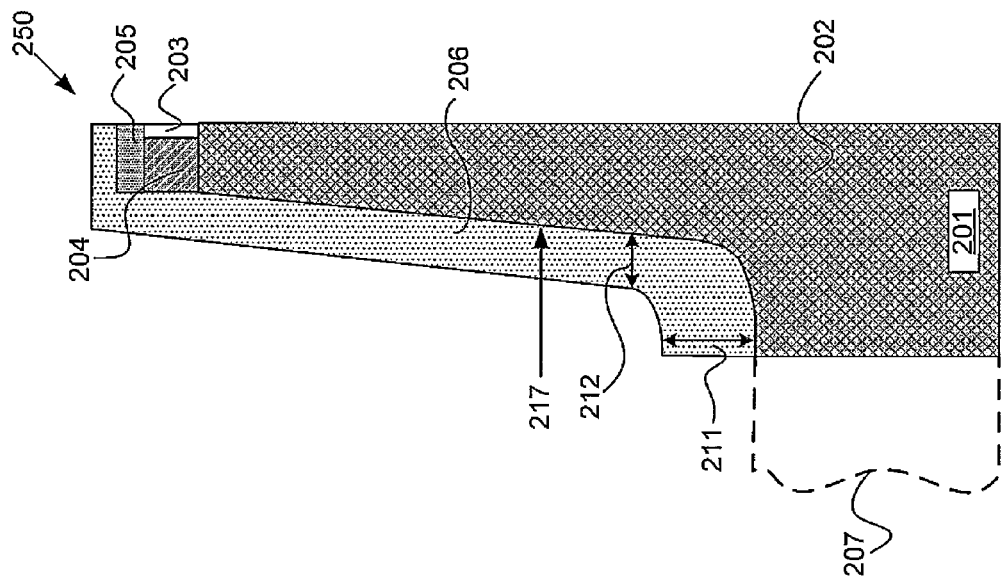
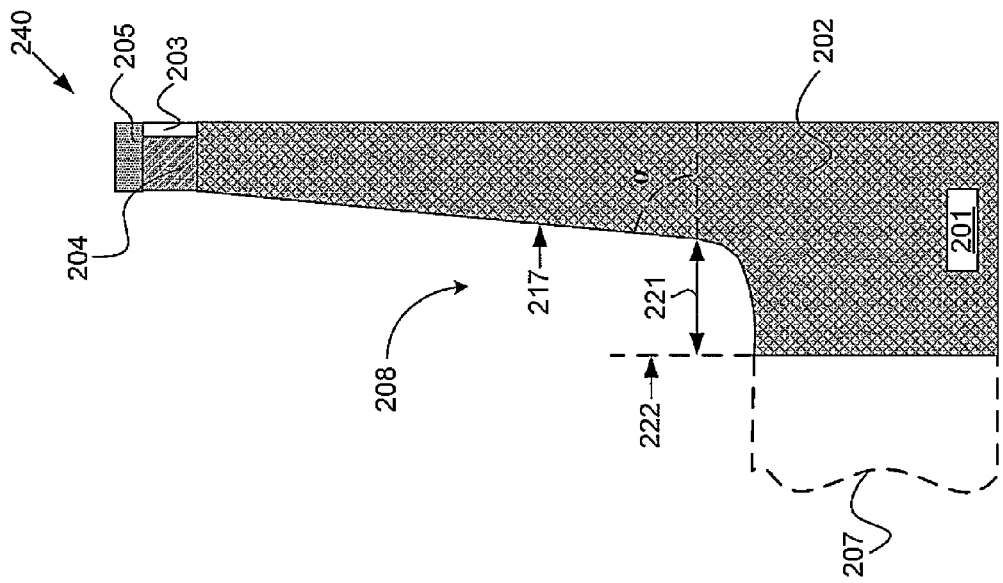
Fig. 2A
Fig. 2B

SEMICONDUCTOR DEVICE WITH A THICK BOTTOM FIELD PLATE TRENCH HAVING A SINGLE DIELECTRIC AND ANGLED SIDEWALLS

The present application claims the benefit of and priority to U.S. Provisional Patent Application Ser. No. 61/824,235, filed on May 16, 2013, and entitled "Semiconductor Trenches Having Thick Bottom Dielectrics Suitable for Field Plates." The disclosure of the above application is hereby incorporated fully by reference into the present application.

BACKGROUND

Power semiconductor devices, such as metal-oxide semiconductor field-effect transistors (MOSFET), are widely used in a variety of electronic devices and systems. Examples of these devices and systems include switches, DC to DC converters, and power supplies. In power devices, improving performance characteristics such as breakdown voltage, ON resistance ($R_{dson}$), and output capacitance are increasingly important. For example, it is desirable to lower $R_{dson}$, increase breakdown voltage, and decrease output capacitance, particularly using methods which do not add to the thermal budget for fabrication of semiconductor devices.

Conventional methods traditionally optimize one performance characteristic at the expense of another. For example, a semiconductor device may reduce $R_{dson}$ at the expense of lowering the breakdown voltage of the device. As such, there is a need for a structure and method for power MOSFETs that can overcome the deficiencies in the art.

SUMMARY

A semiconductor device with a thick bottom field plate trench having a single dielectric and angled sidewalls, substantially as shown in and/or described in connection with at least one of the figures, and as set forth more completely in the claims.

BRIEF DESCRIPTION OF THE DRAWINGS

FIG. 2A illustrates a cross-sectional view of an embodiment of the invention, corresponding to an initial step in the flowchart in FIG. 1.

FIG. 2B illustrates a cross-sectional view of an embodiment of the invention, corresponding to an intermediate step in the flowchart in FIG. 1.

DETAILED DESCRIPTION

Figure 1:
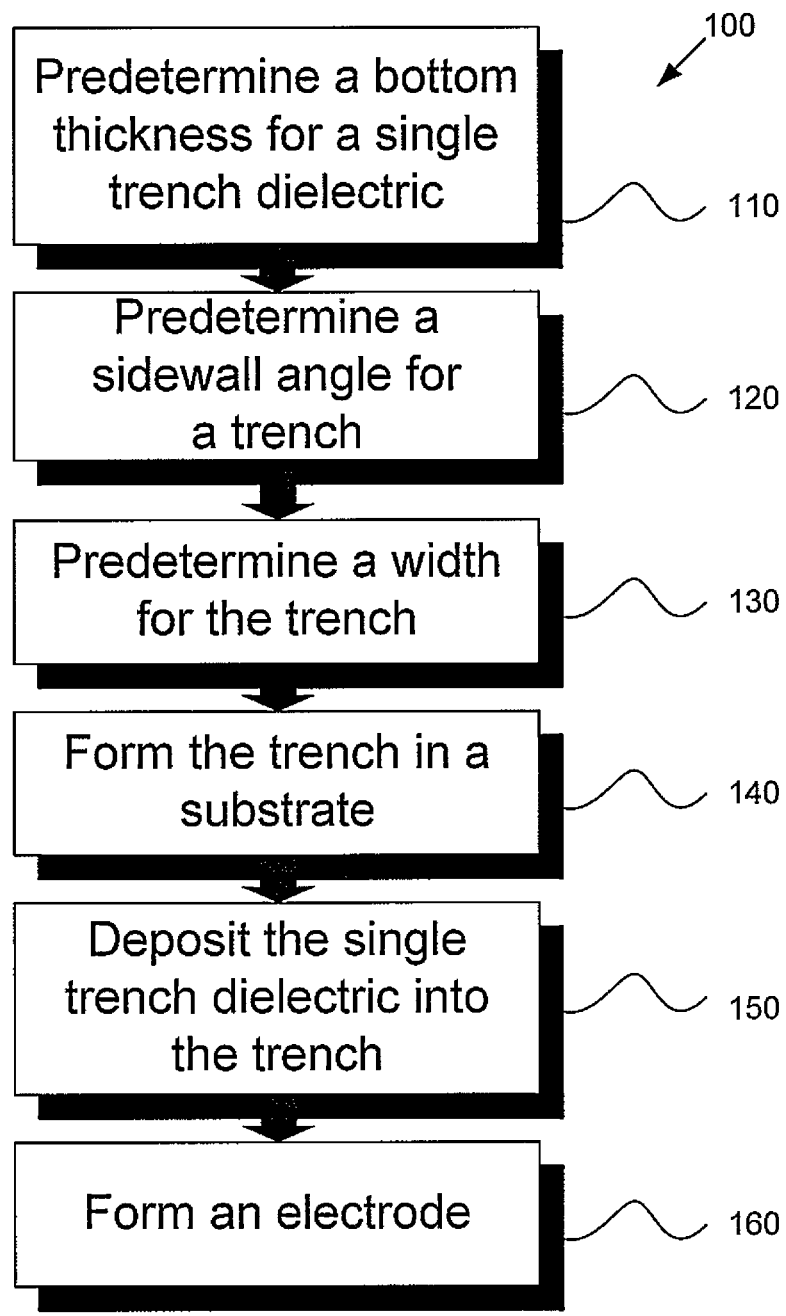
FIG. 1 shows a flowchart illustrating the steps taken to implement an embodiment of the present invention.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

FIG. 1 shows a flowchart illustrating a method for fabricating a power MOSFET according to an embodiment of the present invention. Certain details and features have been left out of flowchart 100 that are apparent to a person of ordinary skill in the art. For example, a step may consist of one or more substeps or may involve specialized equipment or materials, as known to a person of ordinary skill in the art. Steps 110 through 160 indicated in flowchart 100 are sufficient to describe one embodiment of the present invention; however, other embodiments of the invention may utilize steps different from those shown in flowchart 100.

Figure 2C:
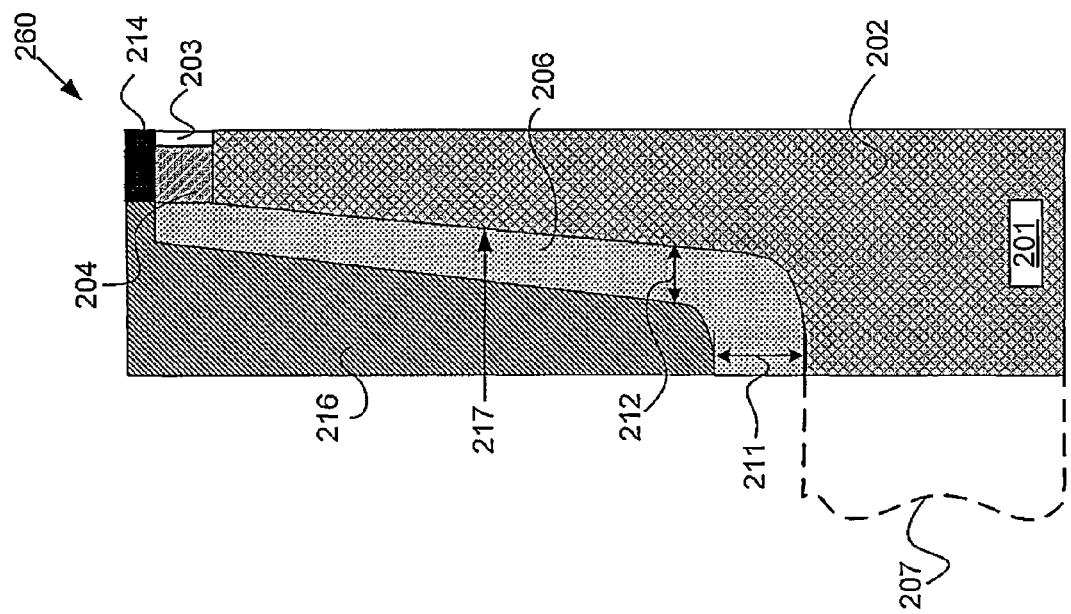
FIG. 2C illustrates a cross-sectional view of an embodiment of the invention, corresponding to a final step in the flowchart in FIG. 1.

Structures 240 through 260 in FIGS. 2A through 2C illustrate the result of performing steps 140 through 160 of flowchart 100, respectively. For example, structure 240 shows a cross-section of a semiconductor structure after processing step 140, structure 250 shows the cross-section of the structure after processing step 150, and so forth.

Referring to step 110 in FIG. 1 and structure 260 in FIG. 2C, step 110 of flowchart 100 includes predetermining bottom thickness 211 for single trench dielectric 206. Bottom thickness 211 of single trench dielectric 206 is chosen to be greater than sidewall thickness 212 of single trench dielectric 206 on sidewall 217 of field plate trench 208. Bottom thickness 211 can be, for example, at least 120% to 140% greater than sidewall thickness 212 of single trench dielectric 206. In some embodiments, bottom thickness 211 may be chosen to be between 1 μm and 2 μm, for example. The predetermination of a desired bottom thickness 211 is made so that a necessary sidewall angle α (FIG. 2A) and a necessary field plate trench width can be calculated such that bottom thickness 211 of single trench dielectric 206 is formed during deposition of single trench dielectric 206 into field plate trench, which is discussed further below.

Referring to step 120 in FIG. 1 and structure 240 in FIG. 2A, step 120 of flowchart 100 includes predetermining sidewall angle α of field plate trench 208. Sidewall angle α is predetermined in order to create desired bottom thickness 211 of single trench dielectric 206 during deposition. During deposition of single trench dielectric 206, once sidewall angle α and the field plate trench width are predetermined, a bottom of field plate trench 208 is filled by single trench dielectric 206 to form bottom thickness 211. In some embodiments, for example, sidewall angle α is less than 85 degrees but greater than 70 degrees.

Referring to step 130 in FIG. 1 and structure 240 in FIG. 2A, step 130 of flowchart 100 includes predetermining the field plate trench width of field plate trench 208. The field plate trench width is predetermined in order to create desired bottom thickness 211 of single trench dielectric 206 during deposition. Half-width 221 is measured from the base of sidewall 217 in field plate trench 208, where sidewall 217 ends and the rounding of the bottom of field plate trench 208 begins, to dashed line 222. Dashed line 222 represents a center of field plate trench 208. Thus, it can be appreciated that half-width 221 only represents half of the field plate trench width. The entirety of the field plate trench width is not shown in the present drawings to simplify illustration of the present inventive concepts. In some embodiments, for example, half-width 221 may be between 0.5 μm and 2 μm, making the field plate trench width 1 μm to 4 μm, respectively.

Referring to step 140 in FIG. 1 and structure 240 in FIG. 2A, structure 240 corresponds to a cross-section of semiconductor substrate 201 after forming field plate trench 208 in semiconductor substrate 201. Semiconductor substrate 201 can be, for example, an N type or a P type silicon substrate. Semiconductor substrate 201 includes drift region 202, body junction 204 and hard mask dielectric 205. Structure 240 further includes gate trench 203, which is only partially represented in FIG. 2A. Gate trench 203 may, for example, include a gate electrode and be lined by a gate dielectric. Although gate trench 203 and body junction 204 are shown in FIG. 2A, in some embodiments of the present invention gate trench 203 and body junction 204 may not have been formed before step 140 of flowchart 100. It is noted that dashed lines 207 in FIG. 2A, as well as in other Figures in the present application, indicate that semiconductor substrate 201 extends beyond the cross-sections specifically shown in the drawings of the present application.

Field plate trench 208 is formed in semiconductor substrate 201 such that the sidewalls, including sidewall 217, are at sidewall angle α as predetermined from step 120 of flowchart 100. Field plate trench 208 is also formed to have the field plate trench width as predetermined from step 130 of flowchart 100. Forming field plate trench 208 can be done by, for example, depositing hard mask dielectric 205 over semiconductor substrate 201, body junction 204, and gate trench 203. Hard mask dielectric 205 may include, for example, tetraethyl orthosilicate (TEOS), silicon dioxide ($SiO_2$), or any other suitable material.

Photoresist can be deposited and patterned over hard mask dielectric 205 and patterns can be formed in hard mask dielectric 205. Thus, hard mask dielectric 205 can be used as a hard mask to form field plate trench 208 in semiconductor substrate 201. Field plate trench, may be, for example, between 5 μm and 15 μm deep. Structure 240 includes sidewall 217 of field plate trench 208, however, structure 240 includes another sidewall similar to sidewall 217 on an opposite side of field plate trench 208, which is not shown in the present drawings to simplify illustration of the present inventive concepts.

Referring to step 150 in FIG. 1 and structure 250 in FIG. 2B, structure 250 shows structure 240 after depositing single trench dielectric 206 in field plate trench 208. In the present embodiment, single trench dielectric 206 is formed by depositing at least one of, for example, TEOS, or another suitable dielectric material, over hard mask dielectric 205 and into field plate trench 208. As a result of field plate trench 208 being formed to have sidewall angle α and the field plate trench width, deposition of single trench dielectric 206 fills the bottom of field plate trench 208 to create bottom thickness 211. Additionally, during deposition of single trench dielectric 206, single trench dielectric 206 builds up on sidewall 217 of field plate trench 208 to form sidewall thickness 212. Bottom thickness 211 is greater than sidewall thickness 212.

In some embodiments, after deposition of single trench dielectric 206, sidewall thickness 212 may be greater than desired. As a result, single trench dielectric 206 may be etched in order to reduce sidewall thickness 212 to the desired thickness. The etching of single trench dielectric 206 may be done by anisotropic or isotropic etching. The etching of single trench dielectric 206, in some embodiments, may also at least partially etch hard mask dielectric 205 but would not completely etch hard mask dielectric 205, due to the thickness of hard mask dielectric 205 in the present embodiment. In some embodiments, however, etching can be done in order to fully remove hard mask dielectric 205, but as is appreciated from FIGS. 2A, 2B, and 2C, hard mask dielectric 205 protects against etch reaching semiconductor substrate 201, body junction 204, and gate trench 203.

Referring to step 160 of FIG. 1 and structure 260 in FIG. 2C, structure 260 shows structure 250 after forming field plate 216 in field plate trench 208. In the present embodiment, field plate 216 is formed by depositing field plate material into field plate trench 208 and etching field plate material to form field plate 216 of desired size. As a result of sidewall angle α, the field plate trench width, and the opening left in field plate trench 208 within the deposited single trench dielectric 206, field plate 216 is formed such that a bottom of field plate 216 is narrower than a top of field plate 216. As such, field plate 216 also has a substantially pointed bottom surface. However, in some embodiments, depending on sidewall angle α and the field plate trench width, field plate 216 may have a rounded or flat bottom surface.

In addition, structure 260 further includes source electrode 214 situated over body junction 204 and gate trench 203. Although body junction 204 and gate trench 203 were formed prior to field plate trench 208 in the present embodiment, in other embodiments these features may be formed at another stage of the fabrication process such as, for example, after forming field plate 216. Furthermore, in other implementations, such as where a gate electrode has not been formed prior to step 160, an additional electrode or electrodes may also be formed in field plate trench 208, such as, for example, a gate electrode.

A power device, such as a power MOSFET, using a trench structure of the present invention offers several benefits and improved performance characteristics. For example, because bottom thickness 211 is greater than sidewall thickness 212, breakdown voltage of the power MOSFET is increased. In addition, due to the fact that the electric field is greatest between drift region 202 and field plate 216, the increased bottom thickness 211 reduces the electric field strength where it is most needed (i.e. at trench bottom) without requiring an increased thickness of single trench dielectric 206 on sidewall 217. Due to the lower electric field, the breakdown voltage is increased. Thus, the doping levels in the semiconductor device can be higher than conventional devices, resulting in a reduced $R_{dson}$ of the power MOSFET. Moreover, the trench structure of the present invention results in a reduction in output capacitance of the power MOSFET. It is noted that while the drawings of the present embodiment have been discussed primarily in relation to a power MOSFET, the present inventive concepts apply to other semiconductor devices as well.

Figure 3:
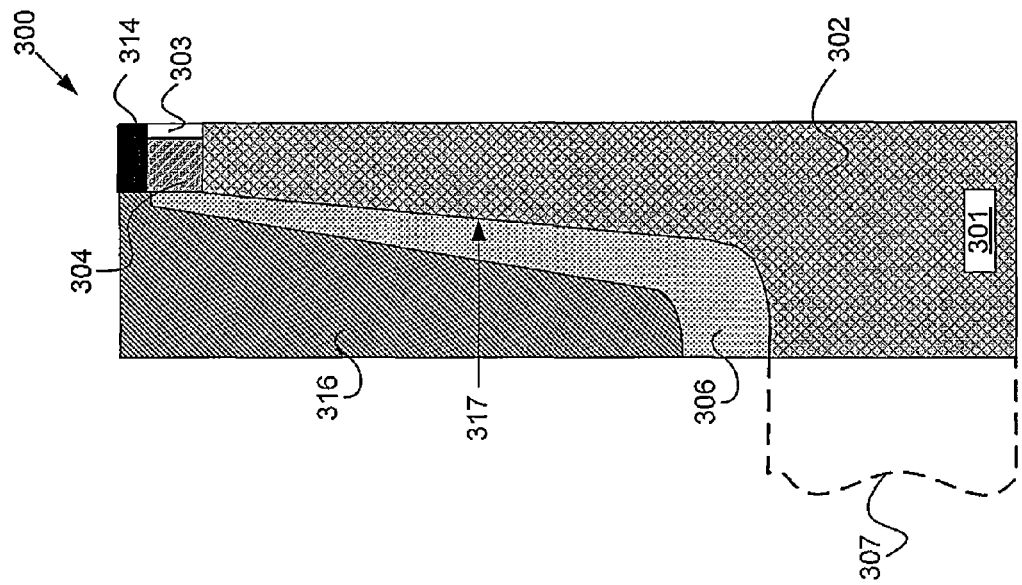
FIG. 3 illustrates a cross-sectional view of another embodiment of the invention.

Referring to another embodiment of the invention shown as structure 300 in FIG. 3, structure 300 corresponds to a cross-section of semiconductor substrate 301 after forming field plate trench 308 in semiconductor substrate 301, depositing single trench dielectric 306 into field plate trench 308, and forming field plate 316 within single trench dielectric 306. Numbered features in FIG. 3 may correspond to similarly numbered features in FIGS. 2A, 2B, and 2C, and thus will not be described in detail. For example, semiconductor substrate 301 may correspond to semiconductor substrate 201, field plate trench 308 may correspond to field plate trench 208, etc.

One distinguishing feature of FIG. 3, as compared to FIGS. 2A, 2B, and 2C, is the shape of single trench dielectric 306 on sidewall 317 of field plate trench 308. In structure 300, single trench dielectric 306 on sidewall 317 may taper from the bottom of sidewall 317 to the top of sidewall 317, such that the thickness of single trench dielectric 306 is significantly less at the top of sidewall 317 than at the bottom. In some embodiments, single trench dielectric 306 may be etched to form the tapered sidewall thickness. However, in other embodiments, depending on sidewall angle α and the field plate trench width, single trench dielectric 306 may be tapered on sidewall 317 as a result of deposition, without requiring etching single trench dielectric 306. In some embodiments, for example, thickness of single trench dielectric 306 at the bottom of sidewall 317 may be 1 μm and thickness of single trench dielectric 306 at the top of sidewall 317 may be 0.5 μm. As a result, field plate 316 has a greater difference between its thickness at the bottom and its thickness at the top, as compared to field plate 216 in FIG. 2C. A power MOSFET using a tapered sidewall structure shares similar performance characteristics as the structure described above in reference to FIGS. 2A, 2B, and 2C. It is noted that while the drawings of the present embodiment have been discussed primarily in relation to a power MOSFET, the present inventive concepts apply to other semiconductor devices as well.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor device comprising:
    a field plate trench, said field plate trench having a predetermined width and a predetermined sidewall angle, said predetermined sidewall angle being less than 85 degrees with respect to a bottom surface of said power semiconductor device;
    a single trench dielectric situated inside said field plate trench, a bottom thickness of said single trench dielectric being determined by said predetermined width and said predetermined sidewall angle, said bottom thickness of said single trench dielectric being at least 120% greater than a sidewall thickness of said single trench dielectric;
    a field plate situated within said single trench dielectric;
    a gate trench situated laterally adjacent to said field plate trench, wherein a depth of said field plate trench is greater than that of said gate trench.

2. The power semiconductor device of claim 1, wherein said sidewall thickness of said single trench dielectric tapers from a bottom of a sidewall to a top of said sidewall.

3. The power semiconductor device of claim 1, wherein said single trench dielectric completely fills a bottom of said field plate trench.

4. The power semiconductor device of claim 1, wherein said predetermined sidewall angle is greater than 70 degrees with respect to said bottom surface of said power semiconductor device.

5. The power semiconductor device of claim 1, wherein said single trench dielectric comprises TEOS.

6. The power semiconductor device of claim 1, wherein a bottom portion of said field plate is pointed.

7. The power semiconductor device of claim 1, wherein said field plate trench is formed in a semiconductor substrate.

8. The power semiconductor device of claim 7, wherein said semiconductor substrate is an N type silicon substrate.

9. The power semiconductor device of claim 7, wherein said semiconductor substrate is a P type silicon substrate.

10. The power semiconductor device of claim 1, further comprising a source electrode, or a body junction.

11. A method of fabricating a power semiconductor device, said method comprising:
    predetermining a bottom thickness of a single trench dielectric to form a field plate trench;
    predetermining a sidewall angle of said field plate trench and a width of said field plate trench such that a later depositing of said single trench dielectric creates said bottom thickness of said single trench dielectric;
    forming said field plate trench in a semiconductor substrate;
    depositing said single trench dielectric into said field plate trench;
    forming a gate trench laterally adjacent to said field plate trench, wherein a depth of said field plate trench is greater than that of said gate trench.

12. The method of claim 11, wherein said bottom thickness is greater than a sidewall thickness of said single trench dielectric.

13. The method of claim 12, wherein said bottom thickness is at least 120% greater than said sidewall thickness.

14. The method of claim 11, further comprising forming a field plate within said single trench dielectric.

15. The method of claim 11, wherein sidewalls of said field plate trench are at an angle of no less than 70 degrees and no more than 85 degrees with respect to a bottom surface of said power semiconductor device.

16. The method claim 11, wherein said single trench dielectric completely fills a bottom of said field plate trench.

17. The method of claim 11, wherein a sidewall thickness of said single trench dielectric tapers from a bottom of a sidewall to a top of said sidewall.

18. The method of claim 11, wherein said single trench dielectric comprises TEOS.

19. The method of claim 11, wherein said semiconductor substrate is an N type silicon substrate.

20. The method of claim 11, wherein said semiconductor substrate is a P type silicon substrate.

* * * * *